(12) United States Patent
Chen et al.

(10) Patent No.: US 11,315,755 B2
(45) Date of Patent: Apr. 26, 2022

(54) METHOD FOR PREPARING A TEM SAMPLE

(71) Applicant: SHANGHAI HUALI INTEGRATED CIRCUIT CORPORATION, Shanghai (CN)

(72) Inventors: Qiang Chen, Shanghai (CN); Yanrong Qiu, Shanghai (CN); Jinde Gao, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 0 days.

(21) Appl. No.: 17/187,282

(22) Filed: Feb. 26, 2021

(65) Prior Publication Data
US 2022/0068600 A1 Mar. 3, 2022

(30) Foreign Application Priority Data
Aug. 31, 2020 (CN) .......................... 202010896075.8

(51) Int. Cl.
*H01J 37/305* (2006.01)
*H01J 37/26* (2006.01)
*G01N 1/28* (2006.01)

(52) U.S. Cl.
CPC .......... *H01J 37/3056* (2013.01); *G01N 1/286* (2013.01); *H01J 37/261* (2013.01); *G01N 2001/2873* (2013.01); *H01J 2237/2802* (2013.01); *H01J 2237/31732* (2013.01); *H01J 2237/31745* (2013.01); *H01J 2237/31749* (2013.01)

(58) Field of Classification Search
CPC ................. H01J 37/3056; H01J 37/261; H01J 2237/2802; H01J 2237/31732; H01J 2237/31745; H01J 2237/31749; G01N 1/286; G01N 2001/2873
See application file for complete search history.

(56) References Cited

U.S. PATENT DOCUMENTS

| | | | |
|---|---|---|---|
| 9,421,560 B2 * | 8/2016 | Conrad | ................ B05B 9/047 |
| 2014/0138350 A1 * | 5/2014 | Kelley | .................... G01N 1/32 216/37 |
| 2014/0190934 A1 * | 7/2014 | Schmidt | ................... G01N 1/32 216/37 |

* cited by examiner

*Primary Examiner* — David E Smith
(74) *Attorney, Agent, or Firm* — Alston & Bird LLP

(57) ABSTRACT

The present application discloses a method for preparing a TEM sample, including the following steps: step 1: providing a thin-film pre-sample with undesirable voids; step 2: performing a first cutting with a first FIB to form the TEM sample located in the target region of the thin-film pre-sample. The first thickness is reached after the first cutting. The voids are exposed from the front surface or the back surface of the TEM sample after the first cutting; step 3: depositing a first material layer by an ALD process to fill the voids in the TEM sample; step 4: performing the second cutting with a second FIB to form the target thickness of the TEM sample in the target region of the thin-film pre-sample. The present application can reduce or eliminate ion beam cutting marks related to the voids in the thin-film pre-sample.

15 Claims, 8 Drawing Sheets

METHOD FOR PREPARING A TEM SAMPLE

CROSS-REFERENCES TO RELATED APPLICATIONS

This application claims priority to Chinese patent application No. CN202010896075.8, filed on Aug. 31, 2020, and entitled "METHOD FOR PREPARING A TEM SAMPLE", the disclosure of which is incorporated herein by reference in entirety.

TECHNICAL FIELD

The present application relates to a method for manufacturing semiconductor integrated circuits, and in particular, to a method for preparing a transmission electron microscope (TEM) sample.

BACKGROUND

In the production process of integrated circuits, TEM is one of the indispensable research and analysis tools. As process develops toward nanometer scales, device sizes have become smaller. The advantages of high resolution and high precision have enabled the TEM technique more widely applied in areas such as chip failure analysis. Precise positioning through focused ion beam (FIB) on a sample mounted on a precision stage during a TEM sample preparation is one of the most important sample preparation means in the chip failure analysis field.

Chip's TEM samples prepared by adopting FIB are is based on very thin pieces from a chip. When FIB is applied to a piece of a chip which has uneven thickness, or is composed of different materials, or if there are voids in the thin-film pre-sample, a kind of ion beam cutting mark defects, also known as the "curtain effect", may be created in the TEM sample. These ion beam cutting marks will affect TEM imaging quality later, even damage the TEM sample and lose it to the failure analysis, especially if it is an ultra-thin TEM sample.

Referring to FIG. 1A, it is a stereoscopic structural view of a TEM sample prepared by adopting an existing method. FIG. 1B is a front view of the sample in FIG. 1A. With the existing method, first, it is necessary to provide a very thin piece for the final TEM sample and perform the one-step FIB cutting to its front and back surfaces to form the TEM sample 101.

The thin chip sample includes a semiconductor substrate 104, a semiconductor device layer 105 having pattern structures on a front surface of the semiconductor substrate 104, and a protective layer 106 on the device layer 105. The TEM sample 101 is formed by cutting a part of the thin-film pre-sample and it keeps the device layer 105 under the protective layer 106.

The TEM sample 101 is a cuboid thin piece. FIG. 1A illustrates a front surface 101a, a left side surface 101b and a top surface 101c of the TEM sample 101. A back surface, a right side surface and a bottom surface are respectively surfaces opposite to the front surface 101a, the left side surface 101b and the top surface 101c of the cuboid. FIG. 1B is a structural view through the front surface 101a.

As chip making process develops into nanometer scales, sizes of devices are becoming smaller, and voids 102 appear more often during the thin-film pre-sample preparation. As the FIB cuts through the thin-film pre-samples, the cutting stress leave cracks which then develop into ion beam cutting marks (curtain effects) labeled as 103 under the voids 102 in the TEM sample 101. These ion beam cutting marks 103 will affect TEM imaging quality later, even damage the TEM sample 101 so it can no longer be used for failure analysis.

FIG. 2 it is a photo of the TEM sample prepared with the existing method. A region corresponding to the dashed box 105a is the semiconductor device layer. Voids were existent in the TEM sample, and ion beam cutting marks are formed below the voids extending outside the device layer area 105a. In FIG. 2, the voids are marked as 102a and the ion beam cutting marks are marked as 103a.

In order to eliminate the ion beam cutting marks related to the voids, one existing improved method is to prepare thicker TEM samples to increase the TEM sample strength. The problems of this method are that the advanced nanometer scale processes demand more strict TEM sample thickness, because thick TEM samples produce serious structural overlap signals making analyses impossible.

Another existing improved method is to prepare a sample by adopting an inverted cutting method. The problems of this method are that the preparation requires 3-5 times longer preparation period than the conventional non-inverted sample preparation time, making it more difficult and higher analysis cost. In addition, the curtain effect also affects the patterned structures above the voids in these techniques.

BRIEF SUMMARY

The present application provides a method for preparing a TEM sample, which can reduce or eliminate ion beam cutting marks related to voids in a thin-film pre-sample for TEM preparation work and thus improve TEM sample quality and the yield rate of sample preparation, The method for preparing the TEM sample provided by the present application includes the following steps:

step 1: providing a thin-film pre-sample, and selecting a target region for forming the TEM sample in the thin-film pre-sample, wherein the thin-film pre-sample has voids;

step 2: performing a first cutting to form a first front surface and a first back surface of the TEM sample in the target region of the thin-film pre-sample by applying a first focused ion beam (FIB); wherein the TEM sample after the first cutting comprises a first thickness between the first front surface and the first back surface, wherein the voids are exposed from the first front surface or the first back surface of the TEM sample, and wherein the first thickness meets a preset condition;

step 3: forming a first material layer to fill the voids in the TEM sample by applying an atomic layer deposition (ALD) process, wherein the preset condition of the first thickness enables filling of the voids;

step 4: performing a second cutting to form a second front surface and a second back surface of the TEM sample in the target region of the thin-film pre-sample by applying a second FIB; wherein the TEM sample after the second cutting comprises a second thickness between the second front surface and the second back surface, and wherein the second thickness is thinner than the first thickness, and wherein the second thickness is a target thickness of the TEM sample.

In some examples, the thin-film pre-sample comprises a semiconductor substrate, a patterned semiconductor device layer formed on a top surface of the semiconductor substrate, and a protective layer on a top surface of the patterned semiconductor device layer; wherein the thin-film pre-sample has a cuboid structure, wherein the thin-film pre-sample and the semiconductor substrate share a same bottom surface, wherein the thin-film pre-sample and the protective layer share a same top surface, and wherein a length and a height of the thin-film pre-sample form edges of a first side surface and an opposing second side surface, and a width and a height of the thin-film pre-sample form edges of a third side surface and an opposing fourth side surface.

In some examples, the first front surface and the first back surface of the TEM sample are parallel to the first side surface and the second side surface of the thin-film pre-sample.

In some examples, in step 2, the first cutting to form the first front surface and the first back surface is performed from the top surface of the semiconductor substrate downward to a bottom surface of the semiconductor substrate.

In some examples, in step 2, the first cutting to form the first front surface and the first back surface is performed from the bottom surface of the semiconductor substrate upward to the top surface.

In some examples, in step 4, the second cutting to form the second front surface and the second back surface is performed from the top surface of the semiconductor substrate downward to the bottom surface.

In some examples, in step 4, the second cutting to form the second front surface and the second back surface is performed from the bottom surface of the semiconductor substrate upward to the top surface.

In some examples, the first thickness is in a range of 100 nm-200 nm.

In some examples, the second thickness is in a range of 10 nm-80 nm.

In some examples, the semiconductor substrate comprises a silicon substrate.

In some examples, in step 2, cutting by the first FIB generates cutting marks at bottoms of the voids, and wherein the cutting marks are formed on the first front surface or the first back surface of the TEM sample.

In some examples, in step 4, after depositing the first material layer, the cutting marks are eliminated from the second front surface or the second back surface of the TEM sample.

In some examples, the first material layer comprises hafnium oxide and aluminum oxide.

In some examples, in step 1, a width of the thin-film pre-sample is the first thickness of the TEM sample, and a thickness of the thin-film pre-sample is more than 500 nm.

In some examples, the thin-film pre-sample is produced by cutting and thinning a portion of a wafer.

In addition, the present application can be implemented by introducing the ALD process once after the TEM sample is thinner than the first thickness, so the present application further has the advantages of simplicity in operation and low cost.

BRIEF DESCRIPTION OF THE DRAWINGS

The embodiments of the present application will be further described below in detail in combination with references to the drawings.

FIG. 6A to FIG. 6D are top views of the TEM sample after each step in the TEM preparation method according to one embodiment of the present application.

DETAILED DESCRIPTION OF THE APPLICATION

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

Figure 3:
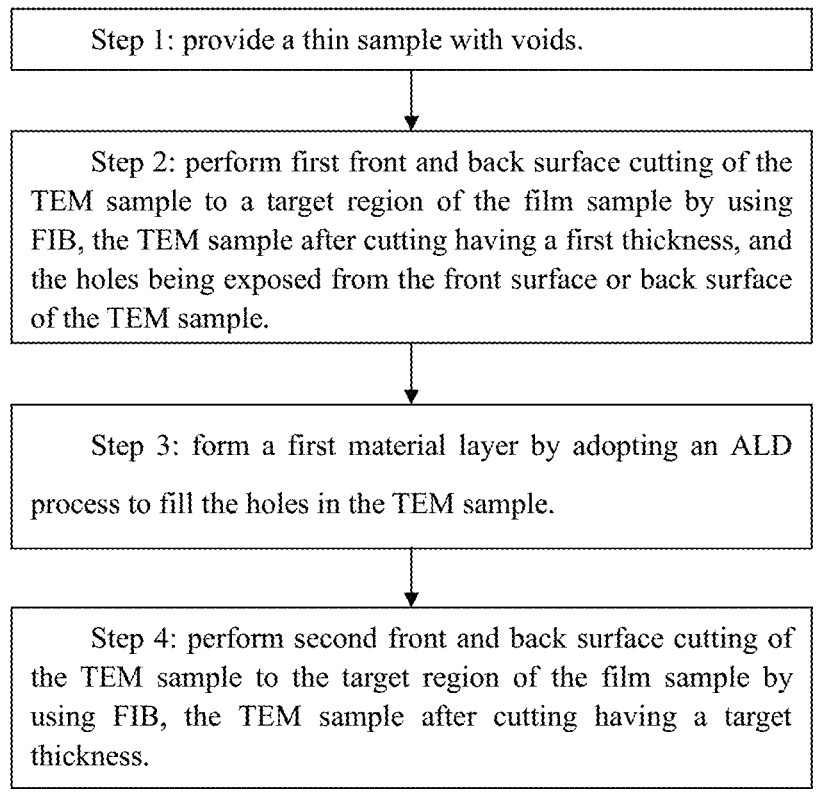
FIG. 3 is a flowchart of a method for preparing a TEM sample according to one embodiment of the present application.

Referring to FIG. 3, it is a flowchart of a method for preparing a TEM sample according to one embodiment of the present application. The method includes the following steps:

In step 1, referring to FIG. 4-6D, a thin-film pre-sample 1 with voids 2 is provided, and a target region for forming the TEM sample is selected in the thin-film pre-sample 1.

In FIGS. 6A-6D, the thin-film pre-sample 1 includes a semiconductor substrate 201, a semiconductor device layer 202 with patterned structures formed on the surface of the semiconductor substrate 201 and under a protective layer 203. The thin-film pre-sample 1 is in a cuboid structure, a bottom surface of the thin-film pre-sample 1 is provided at the bottom surface of the semiconductor substrate 201, a top surface of the thin-film pre-sample 1 is also provided with the top surface of the protective layer 203, and the thin-film pre-sample 1 includes two oppositely facing first side surface and second side surface and two oppositely facing third side surface and fourth side surface. Each side surface has a rectangular shape.

In one embodiment of the present application, the semiconductor substrate 201 includes a silicon substrate.

Figure 4:
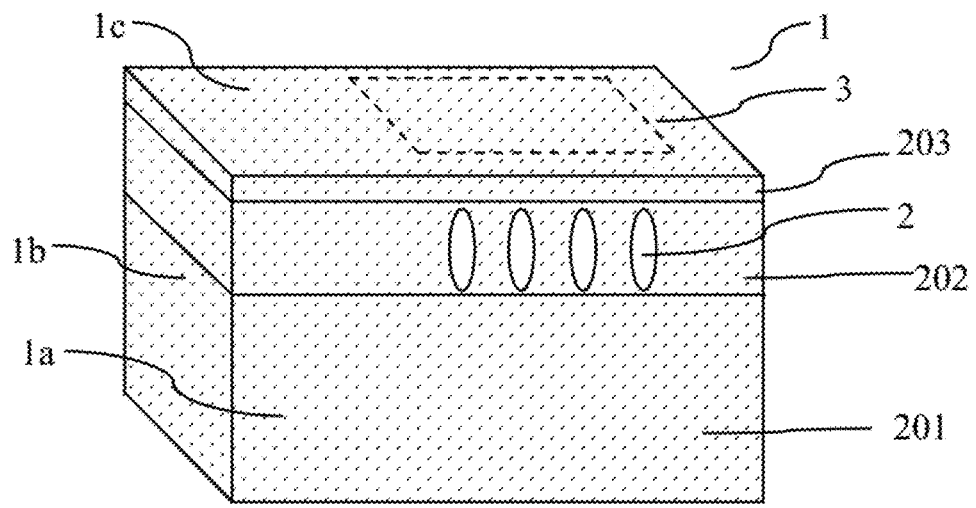
FIG. 4 is a stereoscopic view of a thin-film pre-sample provided with a TEM preparation method according to one embodiment of the present application.

FIG. 4 illustrates a stereoscopic view of the thin-film pre-sample 1. In FIG. 4 the sample has a front surface 1a, a left surface 1b and a top surface 1c. The front surface 1a is the first side surface, and the left surface 1b is the third side surface.

Figure 5A:
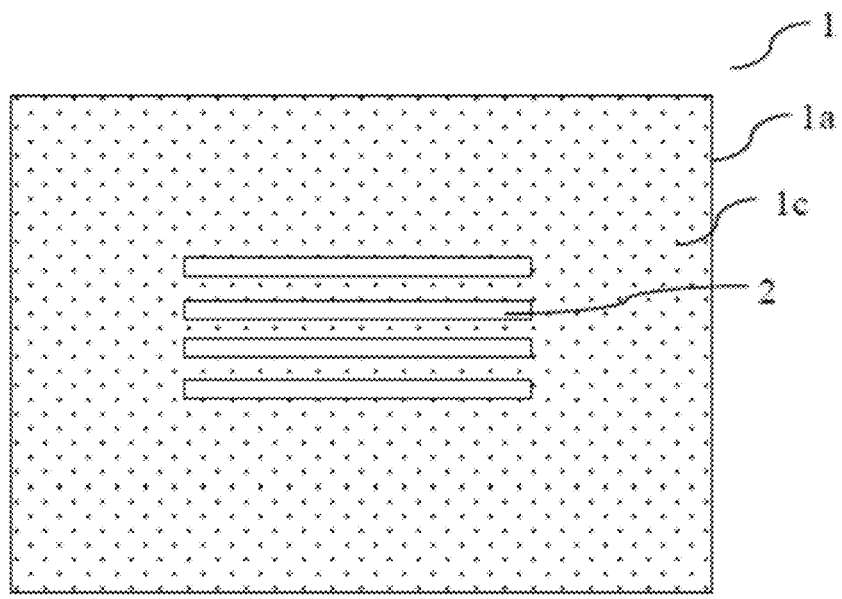
FIG. 5A to FIG. 5D are top views of a thin-film pre-sample following each step of a TEM preparation method according to one embodiment of the present application.

FIG. 5A shows a top view of the TEM sample in FIG. 4. To visualize the voids 2 from the top surface, lines of voids 2 are illustrated as if they are placed on the top surface in FIG. 5A, although these voids are often embedded in the semiconductor device layer 202, thus not readily visible in the top view. The front surface 1a is on the side as marked in FIG. 5A.

Figure 6A:
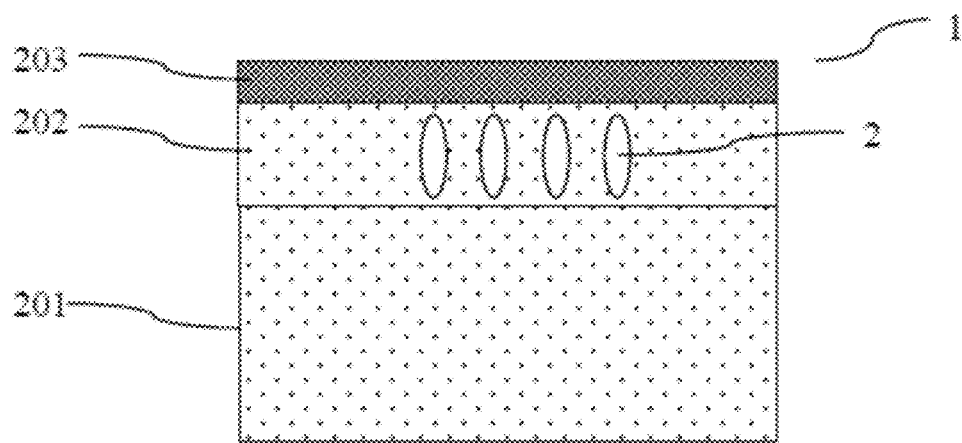
FIG. 6A is a front view of the TEM sample at a step shown in FIG. 5A.

FIG. 6A is a front view of the thin-film pre-sample that has the top view shown in FIG. 5A, which is a front view of the thin-film pre-sample in FIG. 4. FIG. 6A shows the three layers of the chip sample: the semiconductor substrate 201, the semiconductor device layer 202 and the protective layer 203.

Figure 5B:
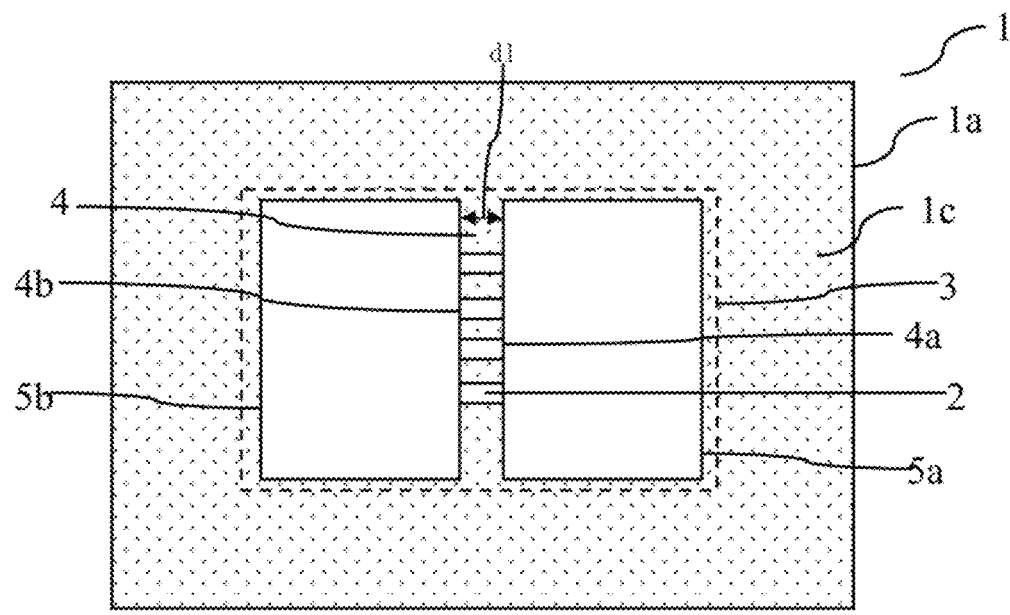

FIG. 5B shows how the target region for forming the final TEM sample 4 is prepared within the dashed box 3 in the thin-film pre-sample 1.

One dimension, for example, one of the widths of the thin-film pre-sample 1 will become the thickness dimension of the final TEM sample. This width of the thin-film pre-sample 1 is more than 500 nm.

The thin-film pre-sample 1 is obtained by cutting and thinning a piece from a target device area on the semiconductor substrate 201.

In step 2, perform FIB cutting first into the target region 3 of the thin-film pre-sample 1 to form the front and back surfaces of the TEM sample 4. The output piece is an intermediate TEM sample 4 which has a first thickness d1 in FIG. 5B between its front surface and back surface. For convenience, this intermediate piece is referred to as the TEM sample 4 although it is not the final TEM sample yet. The voids 2 inside the device layer 202 if there are any may be exposed from the front surface or the back surface of the TEM sample 4. The first thickness d1 has a minimum requirement to be able to apply atomic layer deposition (ALD) technique to fill the voids 2 in the subsequent step 3.

FIG. 5B is a top view after the FIB has trimmed off the first front and back surfaces on the TEM sample 4. The TEM sample 4 at this stage includes a front surface 4a and a back surface 4b, which are parallel to the first side surface 1a and the second side surface of the thin-film pre-sample 1.

Referring to FIG. 5B, the FIB trimming to form the front surface 4a for the intermediate TEM sample 4 involves first cleaning out a cut region 5a, and also the FIB trimming to form the back surface 4b for the TEM sample 4 involves cleaning out a cut region 5b. The semiconductor substrate 201, the semiconductor device layer 202 and the protective layer 203 in the cut regions 5a and 5b are all removed. In the actual process, the order of cutting the front and the back surfaces is not limited, one can first cut the front surface 4a, then the back surface 4b of the TEM sample 4, or first cut the back surface 4b then the front surface 4a, or perform alternate cutting of the front surface 4a and the back surface 4b of the TEM sample 4.

In one embodiment of the present application, cutting the first front and back surfaces is performed starting from the top surface 1c of the semiconductor substrate 201 downward to the bottom surface. In other embodiments, cutting the first front and back surfaces may be performed starting from the bottom surface of the semiconductor substrate 201 upward to the top surface 1c. This bottom up cutting is known as an inverted cutting.

Figure 6B:
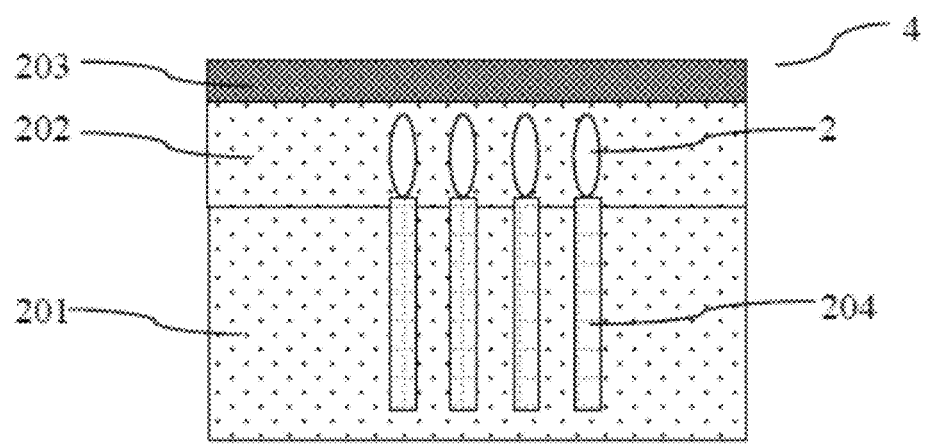

FIG. 6B shows a view from the front surface 4a of the TEM sample 4 in the stage shown in FIG. 5B. The first ion beam cutting has left marks 204 at the bottoms of the voids 2, these marks are formed either on the front surface or on the back surface of the TEM sample 4 whichever surface was cut first.

In one embodiment of the present application, the first thickness d1 should be at the right size, not too thick or too thin, it should enable filling the voids 2 by applying the ALD process in the next step 3. If the first thickness d1 is too thick, the voids 2 cannot be fully filled by a subsequent first material layer 6 in the ALD process, and the voids 2 may open again in the subsequent process of cutting the second front and back surfaces, thereby producing additional ion beam cutting marks under the voids 2. On the other hand, if the first thickness d1 is too thin, the first thickness d1 may be too close to the TEM sample target thickness. In this case, when the first material layer 6 is deposited to fill the voids 2, the first ion beam cutting marks 204 possibly cannot be eliminated either.

In one embodiment of the present application, the first thickness d1 may be in the range of 100 nm-200 nm.

In step 3, a first material layer 6 is deposited in an ALD process to fill the voids 2 in the TEM sample 4.

In one embodiment of the present application, the material of the first material layer 6 includes hafnium oxide and aluminum oxide.

Figure 5C:
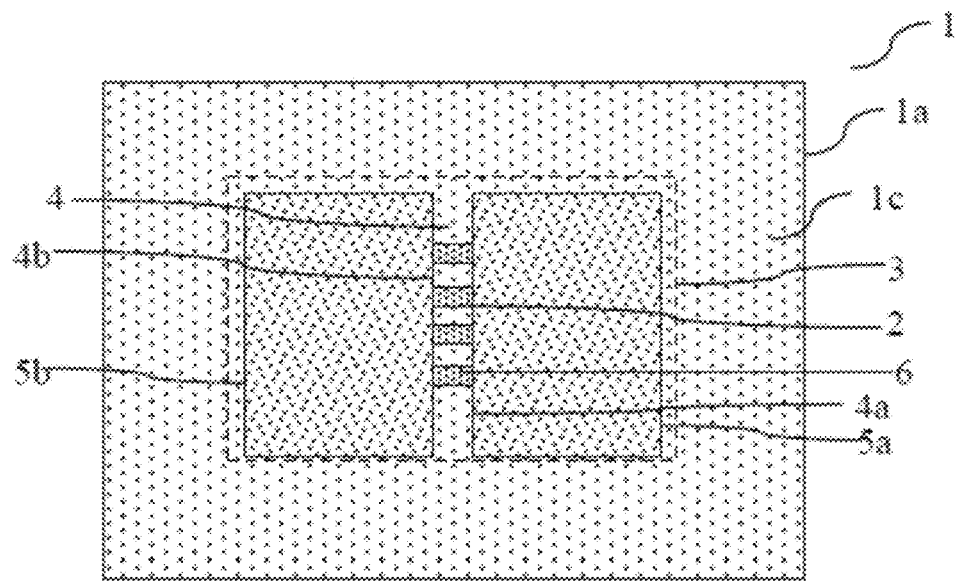

FIG. 5C is a top view of the thin-film pre-sample after the first material layer 6 is deposited. From FIG. 5C, the ALD process is an advanced accurate and precise deposition process for very thin films, and the first material layer 6 is deposited on desired areas in the top surface 1c of the thin-film pre-sample 1. As a result, in FIG. 5C, ALD has deposited the first material layer 6 precisely in the cut regions 5a and 5b, but not in the area outside the target region 3 in the thin-film pre-sample 1 and the top view region of the TEM sample 4.

Figure 6C:
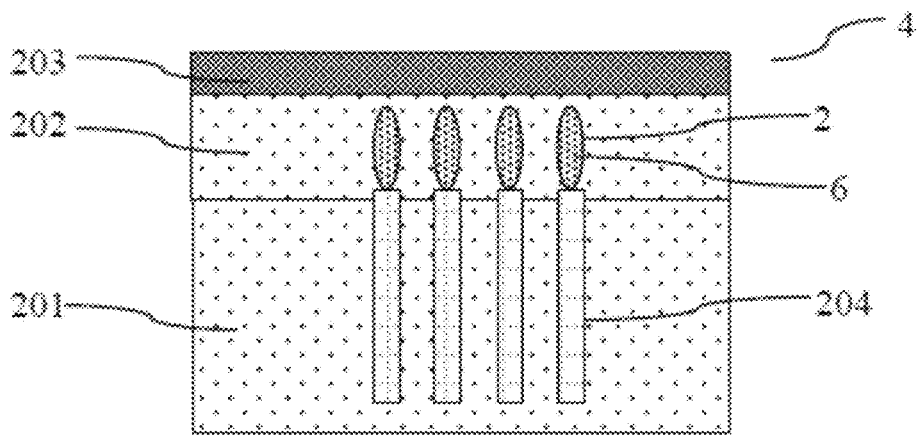

FIG. 6C is a view of the TEM sample 4 from the front surface 4a in FIG. 5C. The first material layer 6 fills the voids 2 very well.

In step 4, perform FIB to the target region 3 of the thin-film pre-sample 1 to form the second front and back surfaces to further trim on the TEM sample 4. The TEM sample 4 at this stage after the second front and back surface cutting form a second thickness d2 between the second front surface and the back surface. Thus the second thickness d2 is thinner than the first thickness d1. In most times, the second thickness d2 has reached the target thickness. In one embodiment of the present application, the second thickness d2 is in the range of 10 nm-80 nm.

Figure 5D:
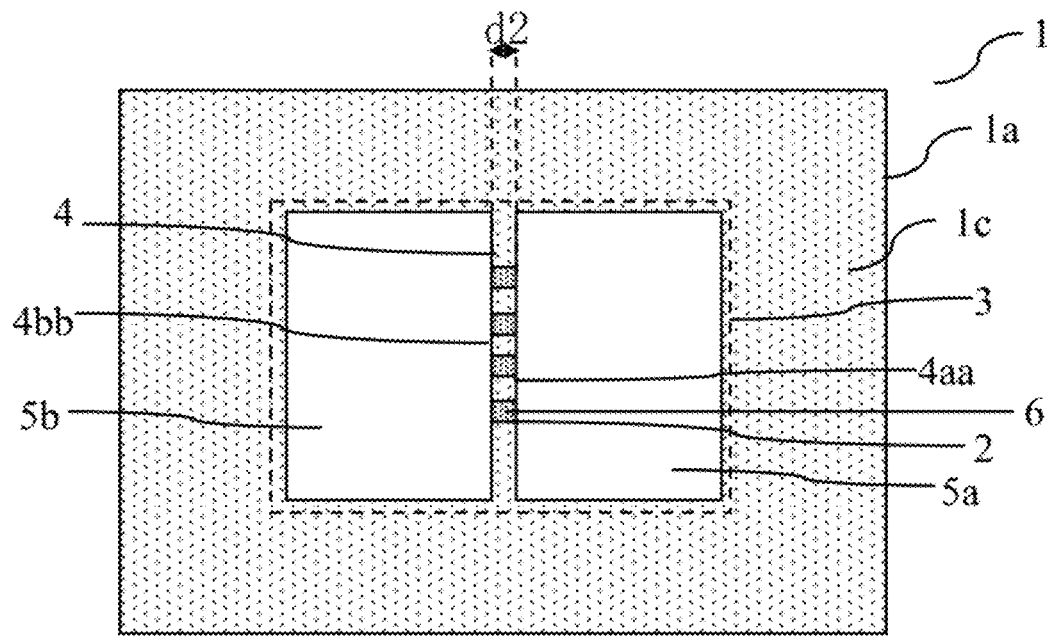

FIG. 5D is a top view of the thin-film pre-sample and the TEM sample 4 within the sample 1, after the second front and back surface cutting is completed. The thickness d2 of the TEM sample 4 has become thinner.

In the actual process, the order of cutting the second front and the back surfaces is not limited, one can first cut the second front surface 4aa, then the second back surface 4bb of the TEM sample 4, or first cut the second back surface 4bb then the second front surface 4aa, or perform alternate cutting of the second front surface 4aa and the second back surface 4bb of the TEM sample 4.

In one embodiment of the present application, the second front and back surface cutting is performed starting from the top surface of the semiconductor substrate 201 downward to the bottom surface. In other embodiments, the second front and back surface cutting may be performed starting from the bottom surface of the semiconductor substrate 201 upward to the top surface. This upward cutting is also known as inverted cutting.

Figure 6D:
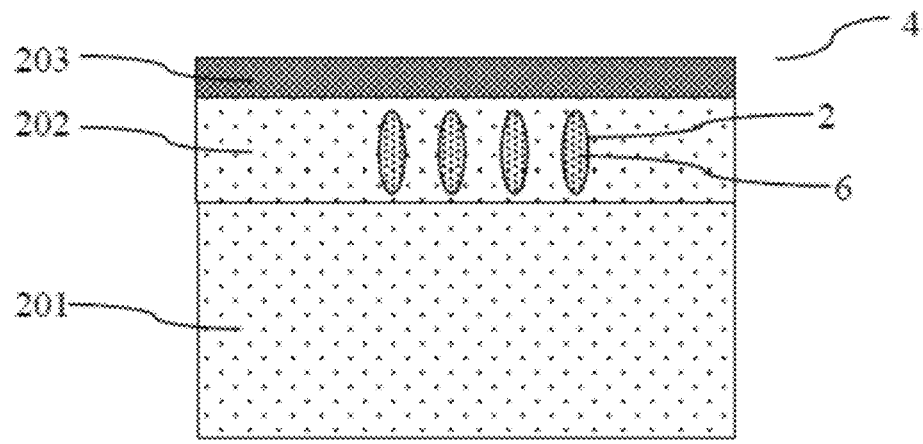

FIG. 6D is a view of the TEM sample 4 from the front surface in FIG. 5D. The ion beam cutting marks left during the second front and back surface cutting is no longer there on the front surface or the back surface of the TEM sample 4 after the first material layer 6 deposition. In addition, the first ion beam cutting marks 204 are also reduced or eliminated after completing the second front and back surface cutting.

Figure 5E:
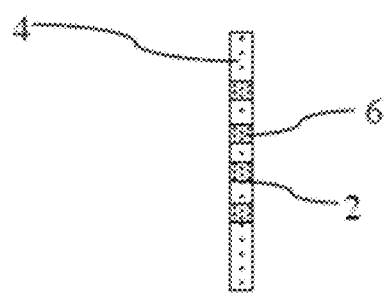
FIG. 5E is a top view of a final TEM sample formed with a TEM preparation method according to one embodiment of the present application.

After the second front and back surface cutting is completed, the TEM sample 4 is required to be cut off from the thin-film pre-sample 1, as illustrated in FIG. 5E, which is a top view after the TEM sample is cut off from the thin-film pre-sample 1.

Figure 1A:
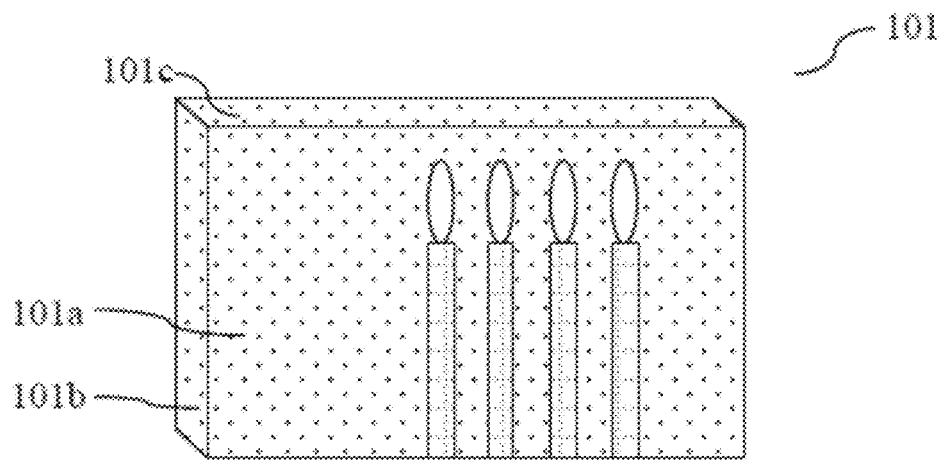
FIG. 1A is a stereoscopic structural view of a TEM sample prepared by adopting an existing method.
Figure 1B:
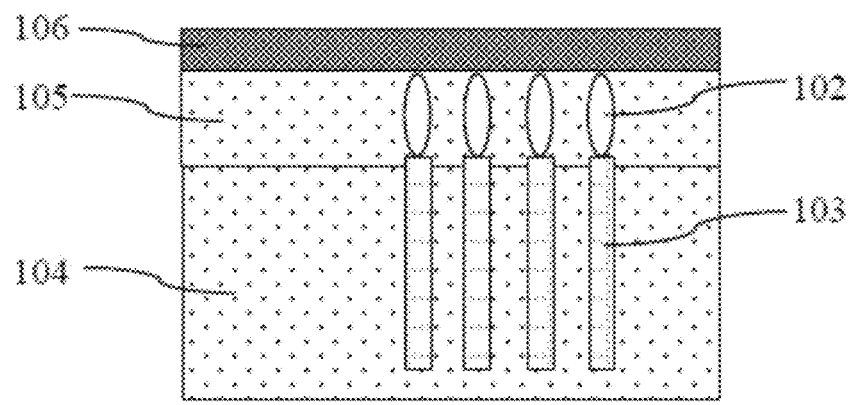
FIG. 1B is a front view of the structure in FIG. 1A.
Figure 2:
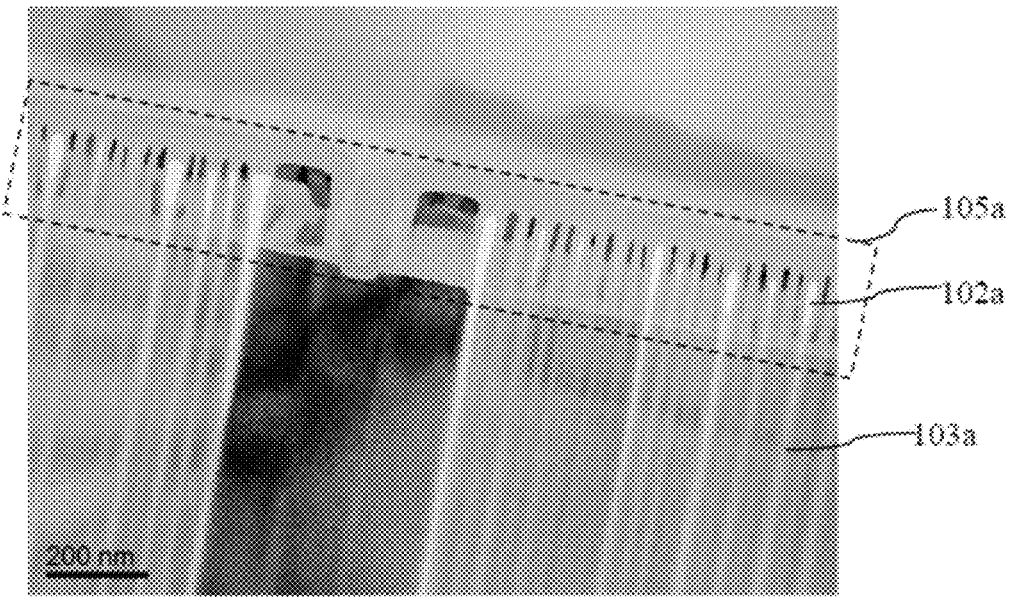
FIG. 2 is an image of the TEM sample prepared by the existing method.
Figure 7A:
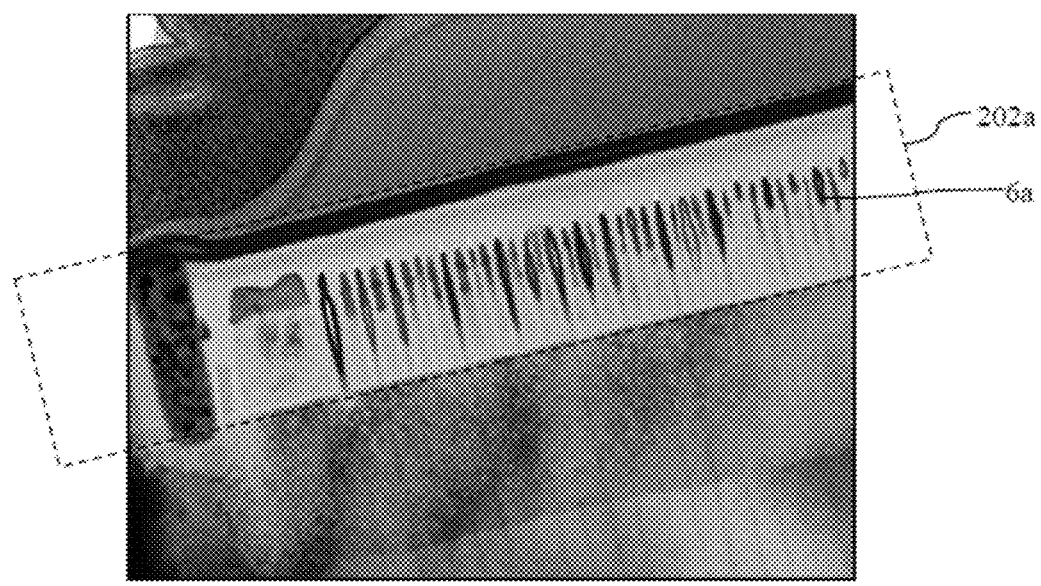
FIG. 7A is the image of the sample prepared by the TEM preparation method according to one embodiment of the present application.
Figure 7B:
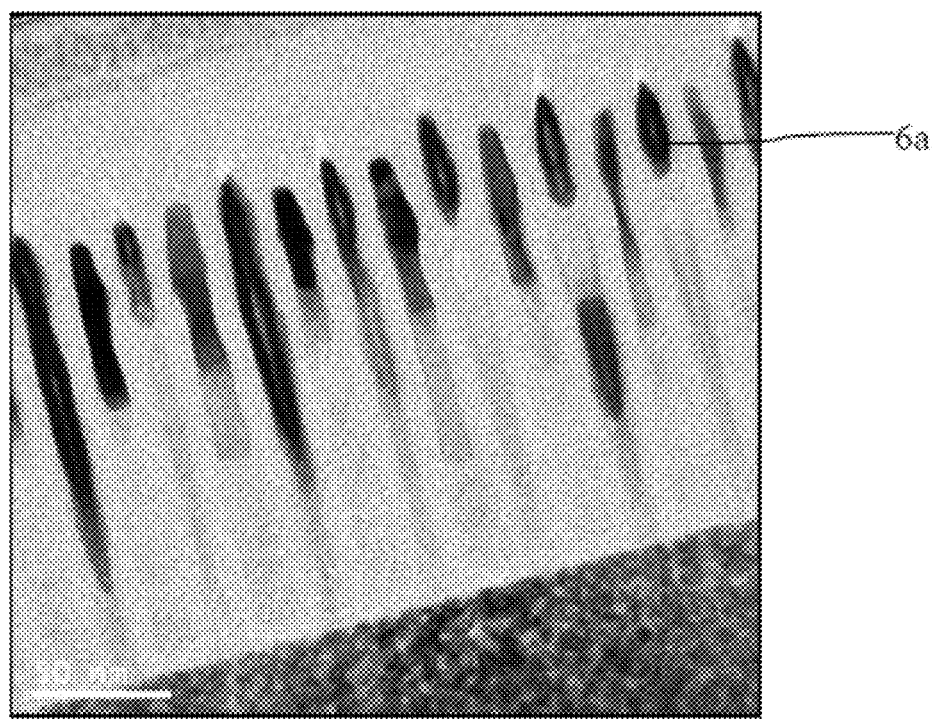
FIG. 7B is an enlargement of the TEM sample image of FIG. 7A.

Referring to FIG. 7A, it is an image of a TEM sample prepared by adopting the disclosed method according to one embodiment of the present application. FIG. 7B is the enlarged image of FIG. 7A, i.e., a higher-magnification image. A dashed box 202a in FIG. 7A indicates the semiconductor device layer, and 6a indicates the first material layer. There are no longer any ion beam cutting marks left at the bottom of the first material layer 6a as the curtain effects which appeared in FIG. 2.

In summary, the existing method forms a TEM sample by performing an one-step front and back surface cutting in the thin-film pre-sample having voids, leaving serious ion beam cutting marks next to these voids. However, according to the embodiment of the present application, the TEM samples can be formed with a two-step cut. The front and back surface cutting process of the TEM sample is divided into two cutting processes, and the ALD process is introduced in the two-step front and back surface cutting processes. In the first front and back surface cutting process the TEM sample is thinned to the first thickness d1, which enables the voids 2 exposed and then fully filled by depositing some material in the ALD process. In this way, the ion beam cutting marks next to the voids can be prevented from being formed in the subsequent second front and back surface cutting process, and the first ion beam cutting marks under the voids produced in the first front and back surface cutting process can be reduced or eliminated after the second front and back surface cutting process, thus the ion beam cutting marks from the voids in the thin-film pre-sample can be reduced or eliminated. Thus, the quality of the TEM samples and the yield rate of sample preparation can be improved, and high-quality ultra-thin TEM samples can be obtained.

In addition, the embodiment of the present application can be implemented by adding an ALD process if the TEM sample is thinner than the first thickness d1, so the embodiment of the present application further has the advantages of simplicity in operation and low in cost.

The present application has been described above in detail through the specific embodiments, which, however, do not constitute limitations to the present application. Without departing from the principle of the present application, those skilled in the art may make many modifications and improvements, which should also be regarded as included in the scope of protection of the present application.

What is claimed is:

1. A method for preparing a transmission electron microscope (TEM) sample, comprising a plurality of steps:
   step 1: providing a thin-film pre-sample, and selecting a target region for forming the TEM sample in the thin-film pre-sample, wherein the thin-film pre-sample has voids;
   step 2: performing a first cutting to form a first front surface and a first back surface of the TEM sample in the target region of the thin-film pre-sample by applying a first focused ion beam (FIB); wherein the TEM sample after the first cutting comprises a first thickness between the first front surface and the first back surface, wherein the voids are exposed from the first front surface or the first back surface of the TEM sample, and wherein the first thickness meets a preset condition;
   step 3: forming a first material layer to fill the voids in the TEM sample by applying an atomic layer deposition (ALD) process, wherein the preset condition of the first thickness enables filling of the voids;
   step 4: performing a second cutting to form a second front surface and a second back surface of the TEM sample in the target region of the thin-film pre-sample by applying a second FIB; wherein the TEM sample after the second cutting comprises a second thickness between the second front surface and the second back surface, and wherein the second thickness is thinner than the first thickness, and wherein the second thickness is a target thickness of the TEM sample.

2. The method for preparing the TEM sample according to claim 1, wherein the thin-film pre-sample comprises a semiconductor substrate, a patterned semiconductor device layer formed on a top surface of the semiconductor substrate, and a protective layer on a top surface of the patterned semiconductor device layer; wherein the thin-film pre-sample has a cuboid structure, wherein the thin-film pre-sample and the semiconductor substrate share a same bottom surface, wherein the thin-film pre-sample and the protective layer share a same top surface, and wherein a length and a height of the thin-film pre-sample form edges of a first side surface and an opposing second side surface, and a width and a height of the thin-film pre-sample form edges of a third side surface and an opposing fourth side surface.

3. The method for preparing the TEM sample according to claim 2, wherein the first front surface and the first back surface of the TEM sample are parallel to the first side surface and the second side surface of the thin-film pre-sample.

4. The method for preparing the TEM sample according to claim 2, wherein in step 2, the first cutting to form the first front surface and the first back surface is performed from the top surface of the semiconductor substrate downward to a bottom surface of the semiconductor substrate.

5. The method for preparing the TEM sample according to claim 2, wherein in step 2, the first cutting to form the first front surface and the first back surface is performed from the bottom surface of the semiconductor substrate upward to the top surface.

6. The method for preparing the TEM sample according to claim 2, wherein in step 4, the second cutting to form the second front surface and the second back surface is performed from the top surface of the semiconductor substrate downward to the bottom surface.

7. The method for preparing the TEM sample according to claim 2, wherein in step 4, the second cutting to form the second front surface and the second back surface is performed from the bottom surface of the semiconductor substrate upward to the top surface.

8. The method for preparing the TEM sample according to claim 1, wherein the first thickness is in a range of 100 nm-200 nm.

9. The method for preparing the TEM sample according to claim 8, wherein the second thickness is in a range of 10 nm-80 nm.

10. The method for preparing the TEM sample according to claim 2, wherein the semiconductor substrate comprises a silicon substrate.

11. The method for preparing the TEM sample according to claim 1, wherein in step 2, cutting by the first FIB generates cutting marks at bottoms of the voids, and wherein the cutting marks are formed on the first front surface or the first back surface of the TEM sample.

12. The method for preparing the TEM sample according to claim 11, wherein in step 4, after depositing the first material layer, the cutting marks are eliminated from the second front surface or the second back surface of the TEM sample.

13. The method for preparing the TEM sample according to claim 1, wherein the first material layer comprises hafnium oxide and aluminum oxide.

14. The method for preparing the TEM sample according to claim 2, wherein in step 1, a thickness of the thin-film pre-sample is more than 500 nm.

15. The method for preparing the TEM sample according to claim 14, wherein the thin-film pre-sample is produced by cutting and thinning a portion of a wafer.

\* \* \* \* \*